United States Patent [19]
Lim et al.

[11] Patent Number: 6,087,887
[45] Date of Patent: Jul. 11, 2000

[54] SIGNAL ROUTING CIRCUITS HAVING SELECTIVE HIGH IMPEDANCE AND LOW IMPEDANCE OUTPUT STATES

[75] Inventors: Jong-hyoung Lim, Suwon; Sang-suk Kang, Yongin, both of Rep. of Korea

[73] Assignee: Samsung Electronics Co., Ltd., Rep. of Korea

[21] Appl. No.: 09/140,677

[22] Filed: Aug. 26, 1998

[30] Foreign Application Priority Data

Jan. 19, 1998 [KR] Rep. of Korea .......................... 98-1426

[51] Int. Cl.[7] ...................................................... H03K 17/62
[52] U.S. Cl. .......................... 327/416; 327/400; 327/415
[58] Field of Search ................................... 327/403, 404, 327/407, 408, 415, 416, 400, 401

[56] References Cited

U.S. PATENT DOCUMENTS

| | | | |
|---|---|---|---|
| 3,588,540 | 6/1971 | Bohn | 327/416 |
| 3,602,738 | 8/1971 | Bohm | 327/416 |
| 5,327,018 | 7/1994 | Karlish et al. | 327/415 |
| 5,378,950 | 1/1995 | Takamoto et al. | 327/401 |
| 5,477,184 | 12/1995 | Uda et al. | 327/404 |
| 5,497,118 | 3/1996 | Ueno et al. | 327/416 |

*Primary Examiner*—Kenneth B. Wells
*Assistant Examiner*—An T. Luu
*Attorney, Agent, or Firm*—Myers Bigel Sibley & Sajovec

[57] ABSTRACT

A dual-purpose transmission circuit capable of receiving two or more signals or voltages, or a signal and a voltage, using one input pad, and an input method using the circuit. The dual-purpose transmission circuit includes an internal signal line for transmitting a signal to the inside of the semiconductor device, an internal voltage line for transmitting a voltage to the inside of the semiconductor device, a first transmission portion for connecting the internal signal line to the outside of the semiconductor device in response to a control signal, in a signal input mode, and a second transmission portion for connecting the internal voltage line to the outside of the semiconductor device in response to the control signal, in a voltage input mode.

20 Claims, 4 Drawing Sheets

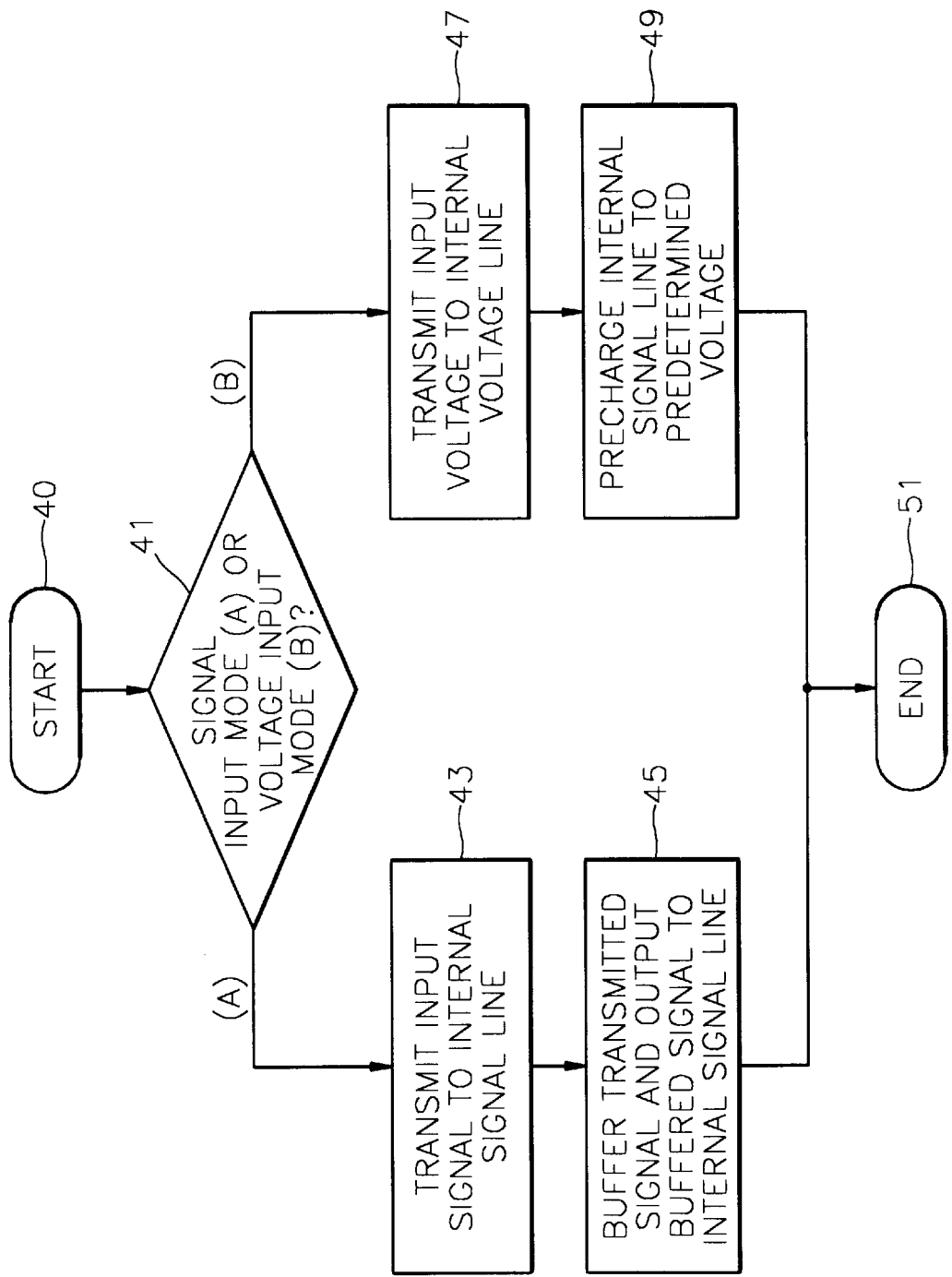

6,087,887

SIGNAL ROUTING CIRCUITS HAVING SELECTIVE HIGH IMPEDANCE AND LOW IMPEDANCE OUTPUT STATES

BACKGROUND OF THE INVENTION

1. Field of the Invention

The present invention relates to a semiconductor device, and more particularly to a dual-purpose transmission circuit capable of receiving two or more signals or voltages, or a signal and a voltage, through a common input pad, and an input method using the same.

2. Description of the Related Art

In general, a semiconductor device has multiple pads for various purposes. For example, some types of pads are a data input pad for receiving data from outside of a semiconductor chip, a data output pad for outputting data from inside of a semiconductor chip, address pads for receiving an address signal from outside of a semiconductor chip, a voltage input pad for applying a predetermined voltage from the outside and a control signal pad for receiving multiple control signals to drive the semiconductor device.

Recently, the number of required pads in a semiconductor device has increased, as higher integration density and more functions are required. Also, the power voltage and ground voltage must be kept constant in a semiconductor device. However, if the load on a voltage line is great, as in a large integrated semiconductor device, it is very difficult to keep a constant voltage during the operation of the device. In order to solve the above problems, a plurality of voltage apply pads may be placed within the semiconductor device. However, the number of pads is limited, because a semiconductor device tends to be miniaturized.

SUMMARY OF THE INVENTION

It is a first object of the present invention to provide a dual-purpose transmission circuit capable of receiving two or more signals or voltages, or a signal and a voltage, using a common pad.

It is a second object of the present invention to provide a semiconductor device requiring a minimal number of pads by adopting the dual-purpose transmission circuit.

It is a third object of the present invention to provide a dual-purpose input method using the dual-purpose transmission circuit.

Accordingly, to achieve the first object, there is provided a dual-purpose transmission circuit for a semiconductor device comprising: an internal signal line for transmitting a signal to the inside of the semiconductor device; an internal voltage line for transmitting a voltage to the inside of the semiconductor device; a first transmission portion for connecting the internal signal line to the outside of the semiconductor device in response to a control signal in a signal input mode; and a second transmission portion for connecting the internal voltage line to the outside of the semiconductor device in response to the control signal in a voltage input mode.

Preferably, the dual-purpose transmission circuit further comprises a buffer for buffering the signal transmitted by the first transmission portion and outputting the buffered signal to the internal signal line. The dual-purpose transmission circuit further preferably comprises a precharge portion, for precharging the internal voltage line to a predetermined voltage in response to the control signal in the voltage input mode.

According to the second object, there is provided a semiconductor device comprising: a pad for electrically connecting the inside and outside of the semiconductor device; an internal signal line for transmitting a signal to the inside of the semiconductor device; an internal voltage line for transmitting a voltage to the inside of the semiconductor device; and a dual-purpose transmission circuit for connecting the pad to the internal signal line in the signal input mode, and to the internal voltage line in the voltage input mode.

To achieve the third object, there is provided an input method in a semiconductor device, for inputting an external signal or a voltage to the inside of the semiconductor device through an internal signal line or through an internal voltage line, via a common pad, the method comprising the steps of: determining whether a mode is a signal input mode or a voltage input mode; transmitting the signal input through the input pad to the internal signal line in the signal input mode; and transmitting the voltage input through the input pad to the internal voltage line, in the voltage input mode. The input method may further comprise the step of buffering the signal input through the input pad and transmitting the buffered signal to the internal signal line, in the signal input mode, and the step of precharging the internal signal line to a predetermined voltage in the voltage input mode.

Therefore, according to the dual-purpose transmission circuit and the input method of the present invention, two or more signals or voltages, or a signal and a voltage, can be input using one pad. Thus, the size of the semiconductor device can be minimized.

BRIEF DESCRIPTION OF THE DRAWINGS

The above objects and advantages of the present invention will become more apparent by reference to the following detailed description of preferred embodiments thereof with reference to the attached drawings, in which:

FIG. 4 is a flowchart illustrating an input method using the dual-purpose transmission circuit according to the present invention.

DESCRIPTION OF THE PREFERRED EMBODIMENTS

Figure 1:
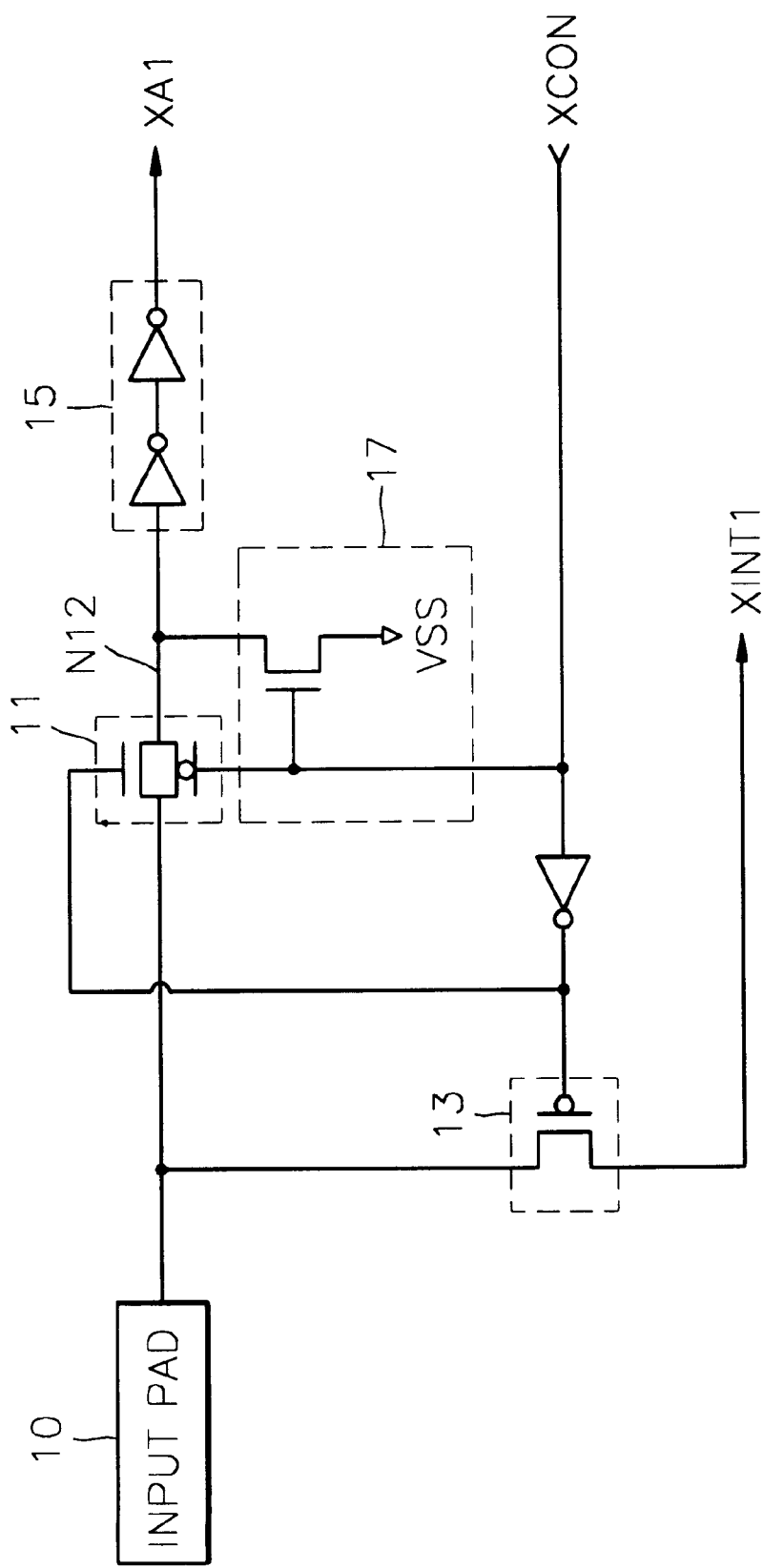
FIG. 1 is a circuit diagram of a dual-purpose transmission circuit according to a first embodiment of the present invention.

As shown in FIG. 1, a dual-purpose transmission circuit according to a first embodiment of the present invention includes an input pad 10, an internal signal line XA1, an internal voltage line XINT1, a first transmission portion 11 and a second transmission portion 13. In a signal input mode, the first transmission portion 11 transmits a signal input from the outside of a semiconductor device to the internal signal line XA1 in response to a control signal XCON. The internal signal line XA1 is a transmission line for transmitting the external input signal to the semiconductor device. In this embodiment, the first transmission portion 11 is a transmission gate. In a voltage input mode, the second transmission portion 13 transmits a voltage input from the outside of the semiconductor device to the internal voltage line XINT1 in response to the control signal XCON. The internal voltage line XINT1 is a transmission line for transmitting the external input voltage to the semiconductor device. In this embodiment, the second transmission portion 13 is a PMOS transistor.

Preferably, the dual-purpose transmission circuit of this embodiment further includes a buffer 15 to buffer the signal transmitted by the first transmission portion 11, and outputs the buffered signal to the internal signal line XA1. The buffer 15 brings the level of a tri-state input signal to a power voltage VCC or a ground voltage VSS. Buffer 15 may be formed, for example, of two inverters connected in series.

Preferably, the dual-purpose transmission circuit includes a precharge portion 17. The precharge portion 17 precharges the output node N12 of the first transmission portion 11 to a predetermined level when the first transmission portion 11 is turned off. Thus, the precharge portion 17 prevents the internal signal line XA1 from floating. In this embodiment, the precharge portion 17 is an NMOS transistor controlled by the control signal XCON.

The operation of the dual-purpose transmission circuit shown in FIG. 1 will now be described. In the signal input mode, the control signal XCON is at a "low" level. Thus, the first transmission portion 11 is turned on and transmits the external signal through the input pad 10. The buffer 15 buffers the signal transmitted by the first transmission portion 11. The second transmission portion 13 is turned off, so that the input signal is not transmitted to the internal voltage line XINT1. The NMOS transistor of the precharge portion 17 stays turned off. As a result, the input pad 10 is used to receive an external signal in the signal input mode.

In the voltage input mode, the control signal XCON is at a "high" level. Thus, the second transmission portion 13 is turned on to transmit the input voltage from input pad 10. The first transmission portion 11 is turned off, so the input voltage is not transmitted to the internal signal line XA1. The NMOS transistor of the precharge portion 17 is turned on. Thus, the voltage at the output node N12 of the first transmission portion 11 is fixed to a ground voltage VSS, thereby preventing the internal signal line XA1 from floating. Here, the input pad 10 is used to receive an external voltage.

In the case where a PMOS transistor is used as the second transmission portion 13, as shown in FIG. 1, high input voltages such as a power voltage VCC can be transmitted effectively. However, if the input voltage is low, such as a ground voltage VSS, then the voltage is boosted by a threshold voltage of the PMOS transistor. Thus, the dual-purpose transmission circuit shown in FIG. 1 is effective at high input voltages.

Figure 2:
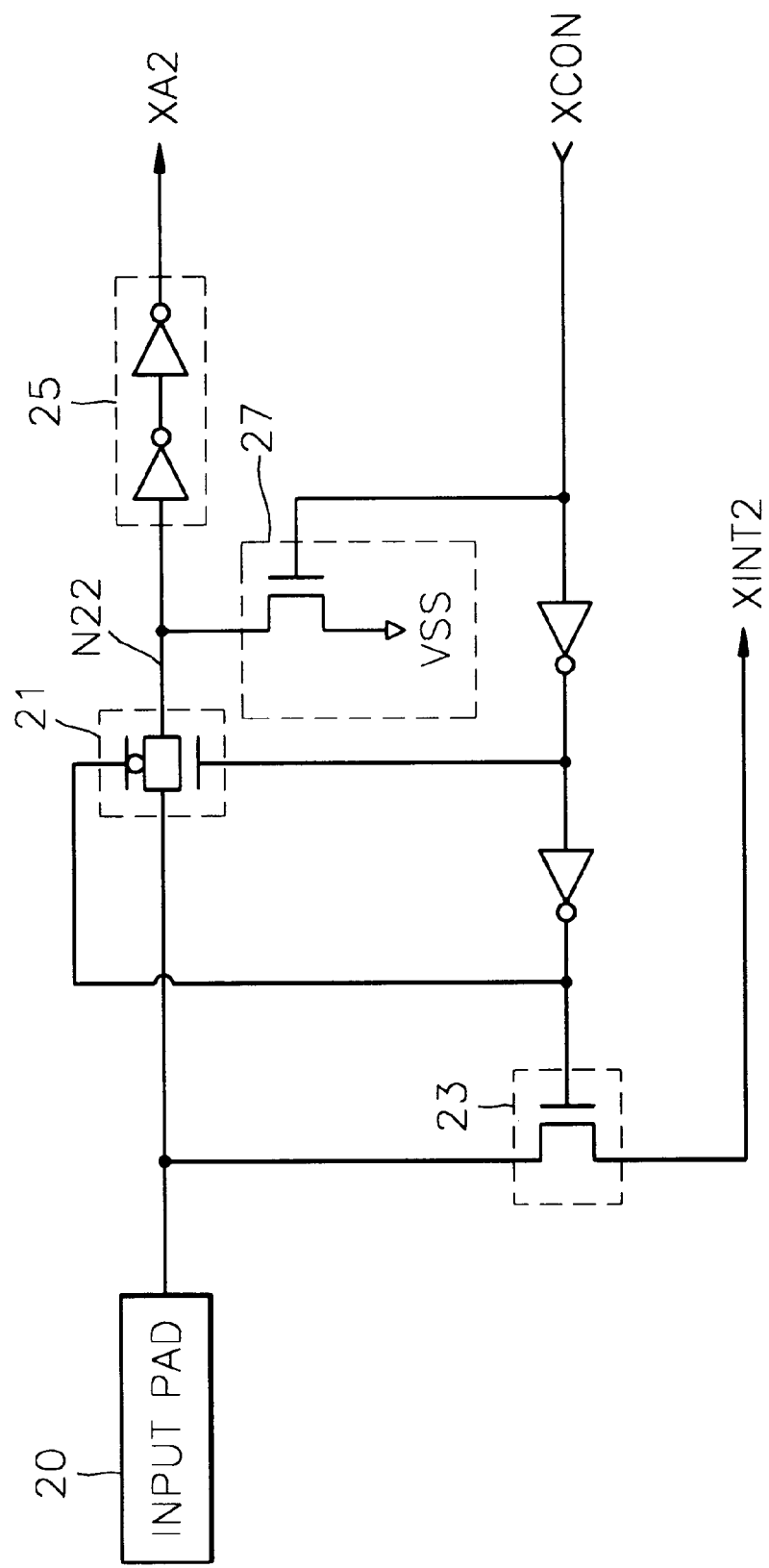
FIG. 2 is a circuit diagram of a dual-purpose transmission circuit according to a second embodiment of the present invention.

Referring now to FIG. 2, there is shown a circuit diagram of a dual-purpose transmission circuit according to a second embodiment of the present invention. The dual-purpose transmission circuit of the second embodiment has nearly the same structure as the first embodiment shown in FIG. 1, except that a second transmission portion 23 is an NMOS transistor instead of a PMOS transistor, which is turned on in a voltage input mode. Thus, in this embodiment a first transmission portion 21, which is a transmission gate, is turned on in a signal input mode, so that the signal input through an input pad 20 is transmitted to an internal signal line XA2. In the voltage input mode, the control signal XCON goes to a "high" level to turn on the second transmission portion 23. Thus, in the voltage input mode, a voltage input through the input pad 20 is transmitted to an internal voltage line XINT2. Also, the NMOS transistor of a precharge portion 27 is turned on in the voltage input mode, thereby preventing the internal signal line XA2 from floating.

In the case where an NMOS transistor is used as the second transmission portion 23 as shown in FIG. 2, low input voltages such as a ground voltage VSS can be transmitted effectively. However, if the input voltage is high, such as a power voltage VCC, then the voltage is dropped by the threshold voltage of the NMOS transistor. Thus, the dual-purpose transmission circuit shown in FIG. 2 is effective at low input voltages.

Figure 3:
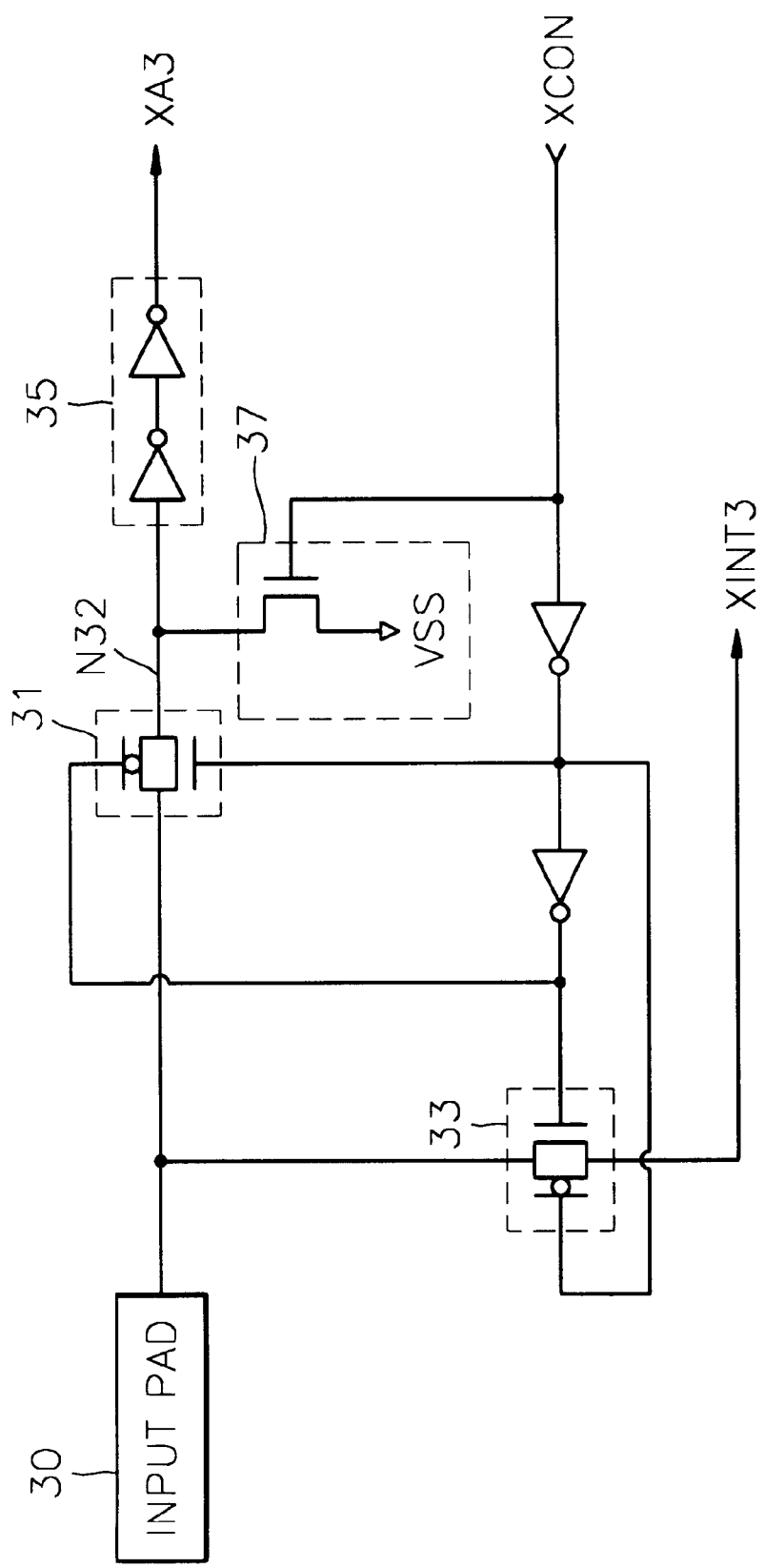
FIG. 3 is a circuit diagram of a dual-purpose transmission circuit according to a third embodiment of the present invention.

FIG. 3 is a circuit diagram of a dual-purpose transmission circuit according to a third embodiment of the present invention.

Referring to FIG. 3, the dual-purpose transmission circuit of the third embodiment has nearly the same structure as the first and second embodiments shown in FIGS. 1 and 2, except that a second transmission portion 33 is a transmission gate, which is turned on in a voltage input mode. Thus, in the third embodiment, a first transmission portion 31 is turned on in a signal input mode, so that the signal input through an input pad 30 is transmitted to an internal signal line XA3. In the voltage input mode, the control signal XCON goes to a "high" level to turn on the second transmission portion 33. Thus, in the voltage input mode, a voltage input through the input pad 30 is transmitted to an internal voltage line XINT3. Also, the NMOS transistor of a precharge portion 37 is turned on in the voltage input mode, thereby preventing the internal signal line XA3 from floating.

In the case where the second transmission portion 33 is a transmission gate, no voltage boost or drop by the threshold voltage occurs, even when the voltage input by the input pad 30 is high, such as a power voltage VCC, or low, such as a ground voltage VSS.

As described above, in the dual-purpose transmission circuits according to the first, second and third embodiments of the present invention, one input pad can be used for either signal input or voltage input.

FIG. 4 is a flowchart illustrating an input method using the dual-purpose transmission circuit according to the present invention.

Referring to FIG. 4, it is determined whether the mode is a signal input mode (A) or a voltage input mode (B) (step 41). If the mode is the signal input mode (A), an input signal is transmitted to the internal signal line (step 43). Then, the transmitted signal is buffered and then output to the internal signal line (step 45).

If the mode is the voltage input mode (B), an input voltage is transmitted to the internal voltage line (step 47), and the internal signal line is precharged to a predetermined voltage (step 49).

While the present invention has been illustrated and described with reference to specific embodiments, further modifications and alterations within the spirit and scope of this invention will occur to those skilled in the art. For example, the internal voltage line in the above embodiments of the present invention is used to transmit only the power voltage or the ground voltage. However, the internal voltage line may also be used to transmit an internal boost voltage VPP or a back bias voltage VBB. Also, although the pad used for intercommunication between the outside and inside of a semiconductor device is an input pad in the above embodiments, the pad may alternatively be an output pad.

What is claimed is:

1. A signal routing circuit having an input port and first and second output ports, comprising:

a first transmission device that transfers a signal from the input port to the first output port in response to a control signal having a first logic state;

a second transmission device that transfers the signal from the input port to the second output port in response to the control signal having a second logic state and disposes the second output port in a high impedance state in response to the control signal having the first logic state; and a pass gate that renders the first output port in a low impedance state by pulling the first output port to a reference potential in response to the control signal having the second logic state.

2. The circuit of claim 1, further comprising a level-shifting buffer having an input electrically coupled to the first output port.

3. The circuit of claim 1, wherein said pass gate comprises an NMOS pull-down transistor having a gate electrode responsive to the control signal.

4. The circuit of claim 3, wherein said first transmission device comprises an NMOS transistor.

5. The circuit of claim 3, wherein said first transmission device comprises a CMOS transmission gate.

6. The circuit of claim 5, wherein said second transmission device comprises a MOS transistor.

7. The circuit of claim 5, wherein said second transmission device comprises a CMOS transmission gate.

8. The circuit of claim 1, wherein said first transmission device comprises an NMOS transistor.

9. The circuit of claim 1, wherein said first transmission device comprises a CMOS transmission gate.

10. The circuit of claim 9, wherein said second transmission device comprises a MOS transistor.

11. The circuit of claim 9, wherein said second transmission device comprises a CMOS transmission gate.

12. A signal routing circuit having an input port and first and second output ports, comprising:

a first transmission device that transfers a signal from the input port to the first output port in response to a control signal having a first logic state;

a second transmission device that transfers the signal from the input port to the second output port in response to the control signal having a second logic state; and a pass gate that renders the first output port in a low impedance state by pulling the first output port to a reference potential in response to the control signal having the second logic state.

13. The circuit of claim 12, further comprising a level-shifting buffer having an input electrically coupled to the first output port.

14. The circuit of claim 12, wherein said pass gate comprises an NMOS pull-down transistor having a gate electrode responsive to the control signal.

15. The circuit of claim 14, wherein said first transmission device comprises an NMOS transistor.

16. The circuit of claim 14, wherein said first transmission device comprises a CMOS transmission gate.

17. The circuit of claim 16, wherein said second transmission device comprises a MOS transistor.

18. The circuit of claim 16, wherein said second transmission device comprises a CMOS transmission gate.

19. The circuit of claim 12, wherein said first transmission device comprises an NMOS transistor.

20. The circuit of claim 12, wherein said first transmission device comprises a CMOS transmission gate.

* * * * *